US005835704A

United States Patent [19]

Li et al.

[11] Patent Number: 5,835,704

[45] Date of Patent: Nov. 10, 1998

[54] METHOD OF TESTING SYSTEM MEMORY

[75] Inventors: Yan Li, Hillsboro; Mahesh Natu, Beaverton, both of Oreg.

[73] Assignee: Intel Corporation, Santa Clara, Calif.

[21] Appl. No.: 744,625

[22] Filed: Nov. 6, 1996

[51] Int. Cl.[6] .................................................. G06F 13/28

[52] U.S. Cl. ................................ 395/183.18; 395/855

[58] Field of Search ......................... 395/183.18, 183.01, 395/182.06, 182.07, 182.03, 855, 383.18, 494, 450, 473, 474; 371/21.1, 21.3

[56] References Cited

U.S. PATENT DOCUMENTS

| | | | |
|---|---|---|---|
| 5,146,582 | 9/1992 | Begun | 395/500 |
| 5,544,098 | 8/1996 | Matsuo et al. | 365/189.07 |
| 5,603,041 | 2/1997 | Carpenter et al. | 395/800 |
| 5,623,633 | 4/1997 | Zeller et al. | 395/473 |
| 5,634,139 | 5/1997 | Takita | 395/855 |

*Primary Examiner*—Ly Hua
*Attorney, Agent, or Firm*—Howard Andrew Skaist

[57] ABSTRACT

A method of testing at least a selected portion of system memory for a microprocessor system is disclosed, the microprocessor system having burst mode capability to transfer data values between the microprocessor and the system memory via a system bus. The method includes the steps of: writing at least a selected portion of system memory with a predetermined test pattern using the burst mode capability of the microprocessor system; reading back values from the at least a selected portion of system memory using the burst mode capability of the microprocessor system; and comparing the values read from the at least a selected portion of system memory with the predetermined test pattern written.

17 Claims, 8 Drawing Sheets

METHOD OF TESTING SYSTEM MEMORY

BACKGROUND OF THE INVENTION

1. Field of the Invention

The present invention relates to system memory and, more particularly, to a method of testing system memory.

2. Background Information

Memories are continually increasing in size. Likewise, systems, such as server platforms, for example, are increasing in the amount of system memory employed. For example, system memory sizes may exceed 1 Gigabyte and over eight Gigabytes of memory is even feasible. An element of a basic input output system (BIOS) is a procedure or process for testing and initializing system memory to ensure that it is operating properly and to identify improperly functioning memory locations. The typical approach to testing and initializing memory for state-of-the-art microprocessors involves disabling the data cache of the microprocessor, disabling the error correcting code (ECC) report operation of the microprocessor, writing to system memory so that every memory location is filled with an initial value with the correct ECC check value, enabling the ECC report operation, then writing to system memory using a predetermined test pattern of data signal values, reading from system memory the data signal values stored in the memory locations written to, comparing the values written with the values read to verify that system memory is operating properly, and writing to system memory to clear its locations. Unfortunately, as memories increase in size, such a process may take a significant amount of time, such as on the order of tens of minutes. A need exists for a faster or more efficient technique for testing memory during system initialization.

SUMMARY OF THE INVENTION

Briefly, in accordance with one embodiment, a method of testing at least a selected portion of system memory for a microprocessor system is described, the microprocessor system having burst mode capability to transfer data values between the microprocessor and the system memory via a system bus.

The method includes the steps of: writing at least a selected portion of system memory with a predetermined test pattern using the burst mode capability of the microprocessor system; reading back values from the at least a selected portion of system memory using the burst mode capability of the microprocessor system; and comparing the values read from the at least a selected portion of system memory with the predetermined test pattern written.

BRIEF DESCRIPTION OF THE DRAWINGS

The subject matter regarded as the invention is particularly pointed and distinctly claimed in the concluding portions of the specification. The invention, however, both as to organization and method of operation, together with objects, features, and advantages thereof, may best be understood by reference to the following detailed description, when read with the accompanying drawings in which:

DETAILED DESCRIPTION OF THE INVENTION

Basic Input Output System (BIOS) is employed to test system memory when a microprocessor system, such as a server platform, for example, is powered on or reset to ensure that it may be used by operating systems and applications later. High-end servers may come equipped with as much as four to eight gigabytes of system memory, for example. A system memory test may take a long time, such as on the order of tens of minutes, even up to 60 minutes, for such memory configurations. System memory test algorithms have not changed significantly from when microprocessor systems had only 640 kilobytes of system memory, as long as 15 years ago.

Figure 1:
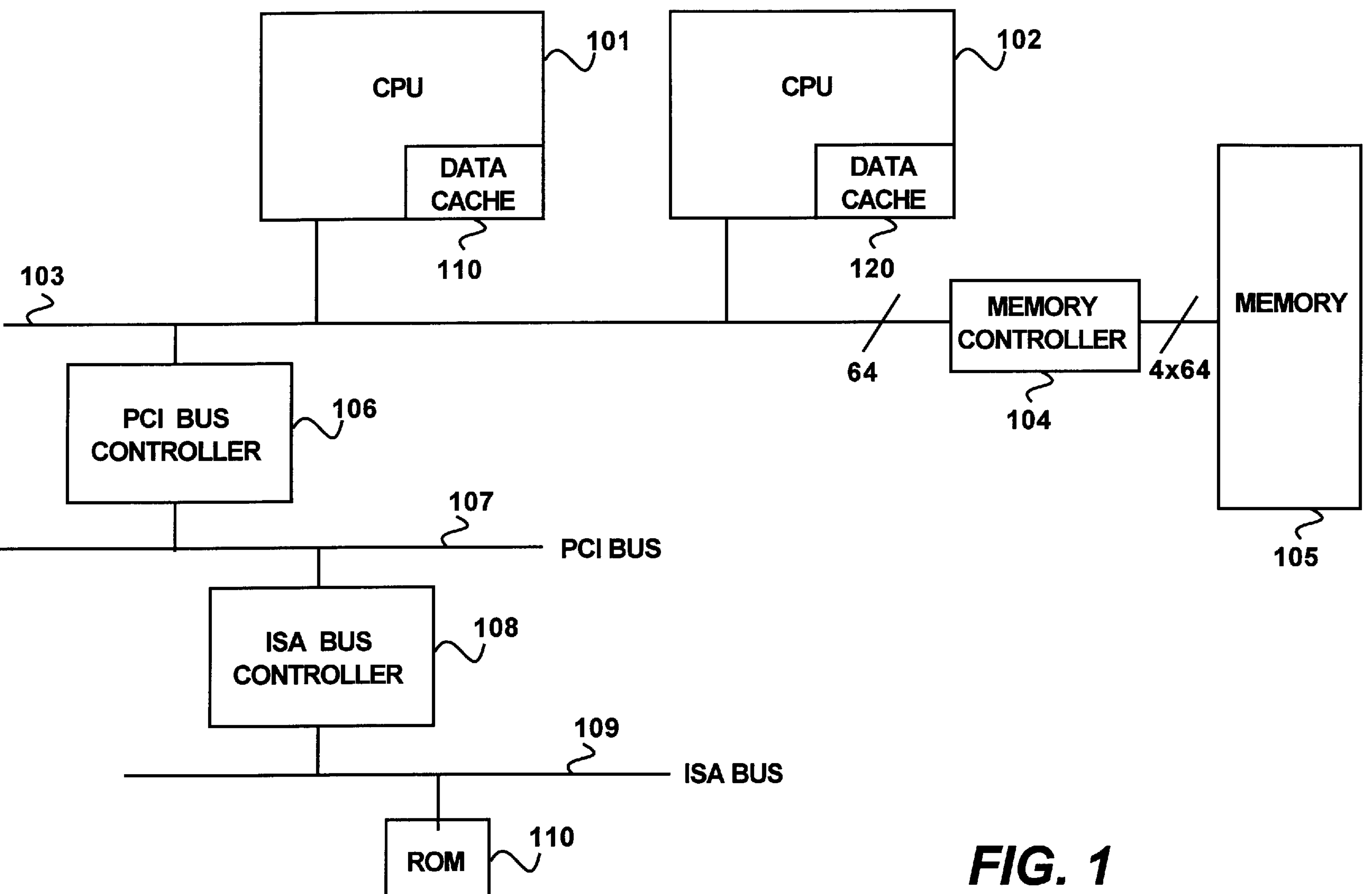
FIG. 1 is a schematic diagram illustrating an embodiment of a system that may employ a method of testing system memory in accordance with the invention.

FIG. 1 is a schematic diagram illustrating an embodiment of a system that may employ a method of testing system memory in accordance with the invention. FIG. 1 illustrates two central processing units (CPUs), 101 and 102, each respectively having a data cache, 110 and 120. Although the scope of the invention is not limited in this respect, these devices may comprise microprocessors available from Intel Corporation, such as the Pentium and Pentium® Pro® microprocessors. It is understood that other details regarding the system have been omitted so as not to obscure the present invention. More information regarding the Pentium Pro microprocessor is provided in the Pentium Pro Family Developers Manual, Vols. 1–3, 1996, available from Intel Corp., herein incorporated by reference.

As illustrated, CPUs 101, and 102 are coupled to a 64-bit system bus 103. Likewise, system bus 103 is coupled through a memory controller 104. The memory controller performs operations such as reading data, combining data, memory control operations, bit error checking and other operations. Memory controller 104 is coupled to system memory 105 via a bus in which four times 64 bits may be transferred at a time. In this context, we refer to the bus coupling the memory controller to the memory as the memory bus. Therefore, the memory controller may, for example, read more data via the memory bus than the microprocessor requests. Likewise, as illustrated in FIG. 1, system bus 103 is coupled via PCI bus controller 106 to PCI bus 107 and PCI bus 107 is coupled via ISA bus controller 108 to ISA bus 109. Likewise, coupled to ISA bus 109 is a ROM or read only memory 110. In this particular embodiment, ROM 110 contains system BIOS. As previously indicated, BIOS is generally the first computer or microprocessor code that runs on a CPU after it is powered-up and one of the operations that BIOS performs includes testing the system memory.

In this particular embodiment, system memory 105 comprises ECC memory. ECC refers to error correcting codes. ECC memory is a specific type of semi-conductor memory that allows correction and/or detection if a limited number of, typically one or two, bits in a memory array are corrupted. ECC dynamic memory employed in Pentium Pro based servers use eight error check bits per 64 bits of data, 72 bits total, although the invention is not limited in scope in this respect. The error checking bits are calculated from the 64 data bits and permit the correction of single bit errors and the detection of multiple bit errors. Typically, ECC memory is desirable because it provides greater reliability over parity memory.

In this context, a memory line refers to the smallest unit of system memory access available. For Pentium and Pentium Pro microprocessors, a memory line comprises eight bytes, although the invention is not limited in scope in this respect. During a read operation, the memory controller reads all 72 bits, 64 data bits plus the eight error checking bits at a time and processes those bits to ensure that no errors have occurred. A similar process is employed in a write operation. If a memory controller detects an error, then it may correct the error and report it. This is referred to as ECC error reporting. When a microprocessor system, such as a server, with ECC memory, is powered up, the ECC data bits and the ECC error check bits contain random values. If the microprocessor tries to read system memory in such a state, the ECC error checking by the memory controller will typically fail, resulting in a stream of error messages from the memory controller. This problem may be addressed by initializing each memory location in the system memory to a known or predetermined value. This is referred to as ECC memory filling.

As indicated previously, the smallest unit of ECC memory in a Pentium Pro microprocessor is 64 bits. In contrast, an uncached write operation to system memory employs 32 bits and includes the memory controller reading 72 bits, merging the 32 bits with these 72 bits, recomputing the ECC error check bits, and writing back all 72 bits. This is a time consuming process. Furthermore, historically, system BIOS has tested system memory with all caches disabled. However, as previously indicated, for the Pentium and Pentium Pro microprocessors, for example, uncached write cycles use only half the memory line, e.g., 32 out of 64 bits, and are slow. Therefore, the bottleneck for the uncached ECC memory test is the system bus employing the single half line write cycle.

Data cache, as illustrated in FIG. 1, for example, by 110 and 120, comprises a fast memory where the CPU maintains the data and code that it frequently accesses. Write through cache is a type of cache where each write to cache is accompanied by a write to the system memory, thereby ensuring that the cache is in sync with the system memory. In a write back type of cache, a write to cache does not immediately update the system memory. Therefore, write back cache gives better performance in terms of speed and is employed, for example, in Pentium and Pentium Pro microprocessors. In this context, a cache line is the smallest unit of cache accessible. For the Pentium and Pentium Pro microprocessors, a cache line comprises 32 bytes, although the invention is not limited in scope in this respect. Cache fill is an operation in which a copy of a memory location in system memory is created in the cache. The microprocessor copies one cache line of data or code from the system memory to cache. Cache flush comprises a reverse operation where one line of cache is purged from the cache and copied to the system memory. Cache fill and cache flush occur so frequently that typically microprocessors, such as the Pentium and Pentium Pro microprocessors, have designed these operations so that they occur at improved speeds compared with other uncached system memory operations. In this particular embodiment, cache fill and flush may involve 32 bytes of data. When this is performed it is referred to as a burst operation, burst mode operation, or burst mode capability, and the microprocessor performs a 32 byte read or write operation where 8 bytes of data are transferred in consecutive clock cycles, although the invention is not limited in scope in this respect. Assuming, for example, a six clock pulse overhead, this burst operation may be executed in ten clock pulses, i.e., 6 clock pulses plus 4 clock pulses, whereas otherwise, the same operation would take 28 clock pulses, i.e., 4 times 7 clock pulses. Burst read, for example, in Pentium Pro microprocessors is about three times as fast as four separate 8 byte reads. An efficient data cache memory and an efficient burst mode operation are typically employed in microprocessors other than Pentium and Pentium Pro microprocessors. The specifics regarding burst operations are well-known by those of ordinary skill in the art and will not be discussed in any further detail.

Pentium Pro microprocessor systems also allow microprocessor systems to accomplish write combining, referred to as uncacheable, speculative, write combining (USWC). When such an operation is employed, the microprocessor may combine memory writes to nearby locations, such as within a single cache line, as a single write. This permits a number of write operations that would have taken a number of bus operations to be merged into a single burst write operation. For the Pentium Pro microprocessor, eight consecutive write instructions may be handled in this manner. Therefore, in this context, this is also referred to as a burst operation, burst mode operation or burst mode capability.

As previously indicated, testing system memory involves several high level cycles or process steps. First, the system memory is filled to initialize values. This occurs immediately after applying power because the system memory has random data and random ECC check bits. Typically, during this operation, the ECC memory error report is disabled. The next cycle of operations comprises writing a test pattern to system memory, reading the test pattern from system memory and comparing the results. This is the basic step to ensure that system memory is operating properly. Finally, system memory is initialized to a consistent value. This operation is similar to memory filling except that the ECC memory report is enabled.

FIG. 2 is a flowchart illustrating one embodiment of a method of testing the system memory in accordance with the invention. Such an embodiment may be employed by the system of FIG. 1, for example. For the purpose of this embodiment, assume microprocessor 101 performs the testing of system memory in accordance with BIOS instructions stored in ROM 101. Of course, alternatively, a random access memory (RAM) may be used to store these instructions. It will, of course, be appreciated that the invention is not limited in scope to this particular embodiment. This particular embodiment uses the burst mode capability of a write back cache to test system memory more efficiently. This embodiment is illustrated based on a Pentium or Pentium Pro microprocessor, although the invention is not limited in scope in this respect. As illustrated in FIG. 2*a,* in step 202 the data cache write back feature is enabled to cover the entire system memory 105. In an alternative embodiment, less than the entire system memory may be covered. In step 204, the ECC error reporting feature is disabled. As previously indicated, this is useful because system memory contains random data after power-on. Next, a loop is formed so that data cache 110, for example, may be employed to process the entire system memory, although alternatively, only selected portions of memory might be initialized. In this particular embodiment, assume an 8 kilobyte data cache, although, again, the invention is not limited in scope in this respect. Thus, in step 206, a single double word memory location per data cache line is read to fill cache. Reading a single double word memory location will transfer a system memory line to cache in a burst mode operation. Therefore, this approach provides efficiency. Therefore, this is done 32 bytes at a time for each data cache line until the 8 kilobyte data cache is filled in this particular embodiment. Of course, in alternative embodiments, a less efficient approach to utilizing the data cache may be employed. At step 208, microprocessor 101 writes initialization values to fill the 8 kilobyte data cache in double word write operations to system memory. In step 210, the data cache is flushed to system memory. As previously indicated, this flush operation is also a burst mode write operation that is the reverse of reading a single double word memory location. This may be accomplished either by thrashing the data cache or explicitly by writing back to system memory. For thrashing, reading more data to the cache results in a writing back operation to system memory. Then, as indicated by diamond 212, this loop is continued in 8 kilobyte data cache sized blocks until the entire system memory has been initialized for this particular embodiment.

The previous portion of the flowchart performs the operation of initializing system memory. However, because the data cache was employed so as to utilize the burst mode capability of the microprocessor system, instead of disabling the cache, which is the typical approach, these operations are performed much faster than is typically accomplished.

Figure 2A:
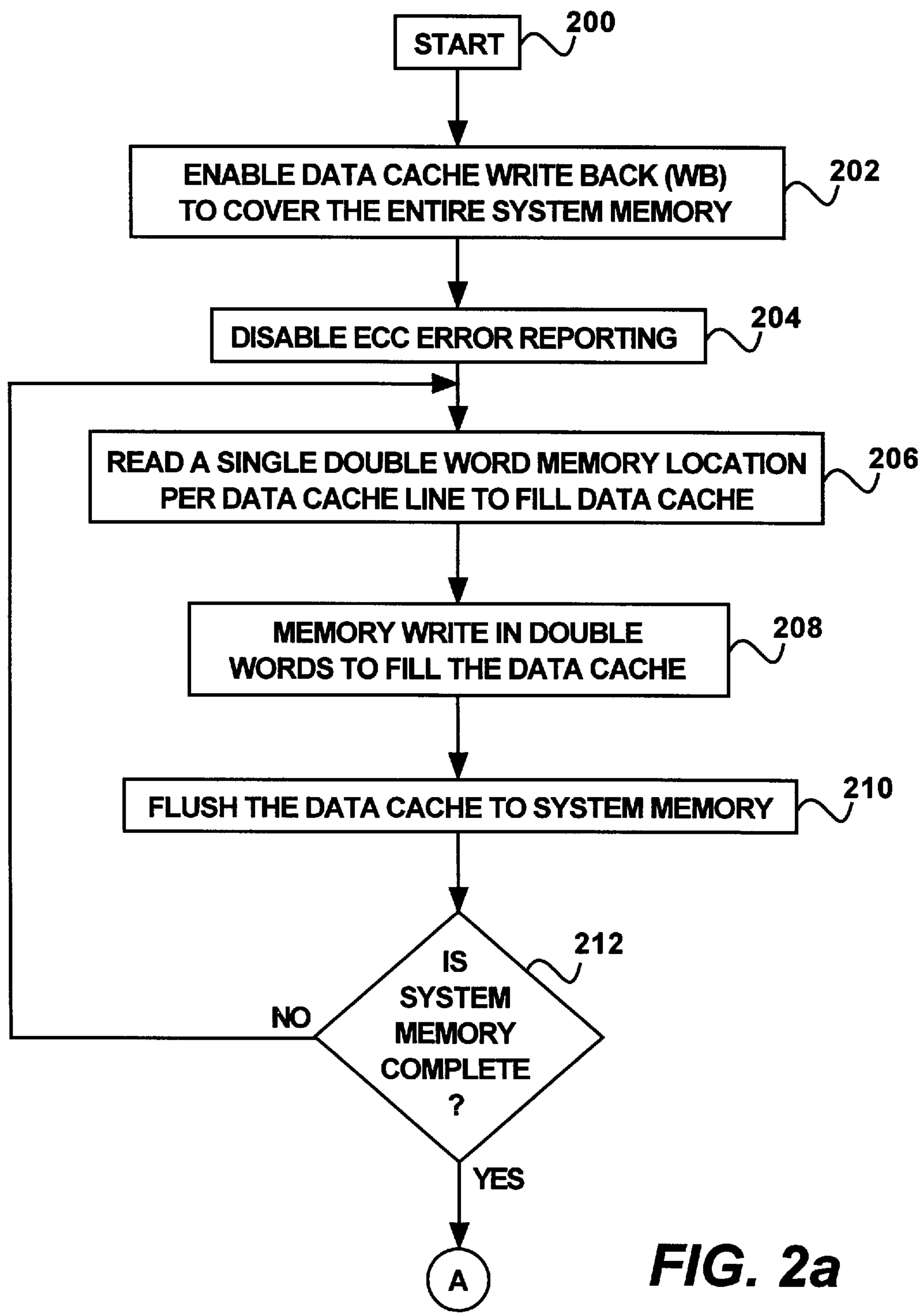
FIGS. 2*a*–2*d* are flowcharts illustrating one embodiment of a method of testing system memory in accordance with the invention.
Figure 2B:
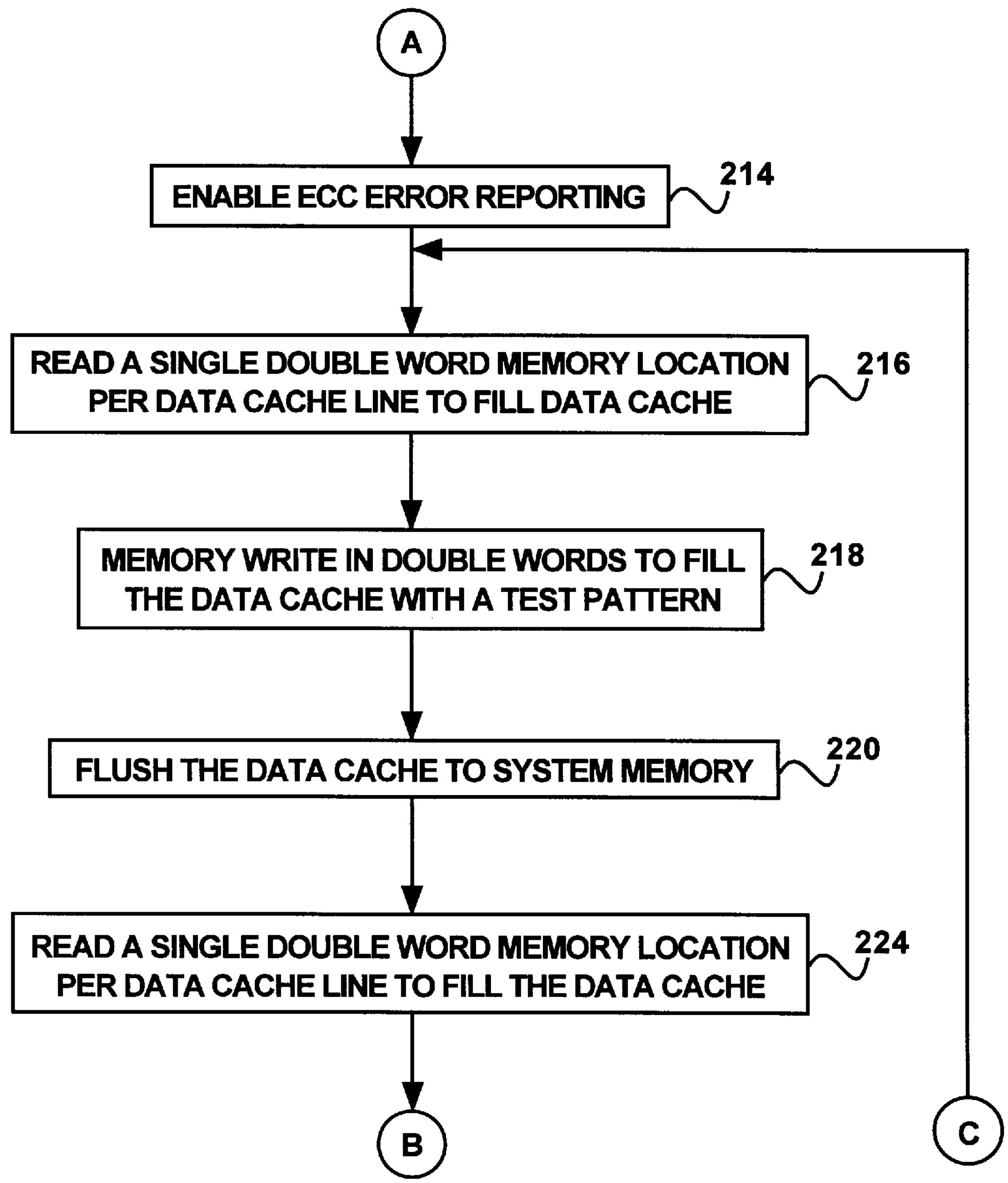
Figure 2C:
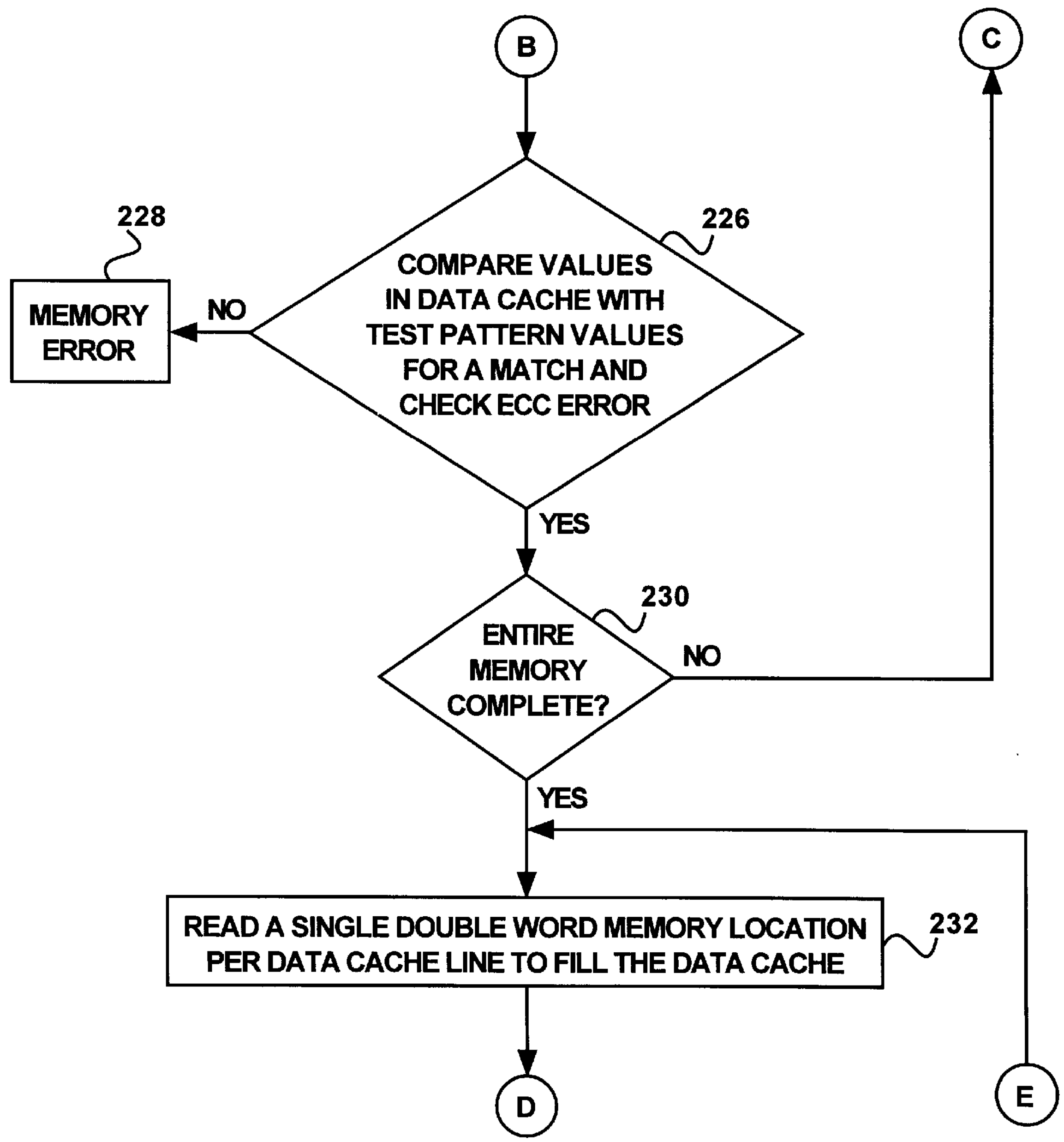
Figure 2D:
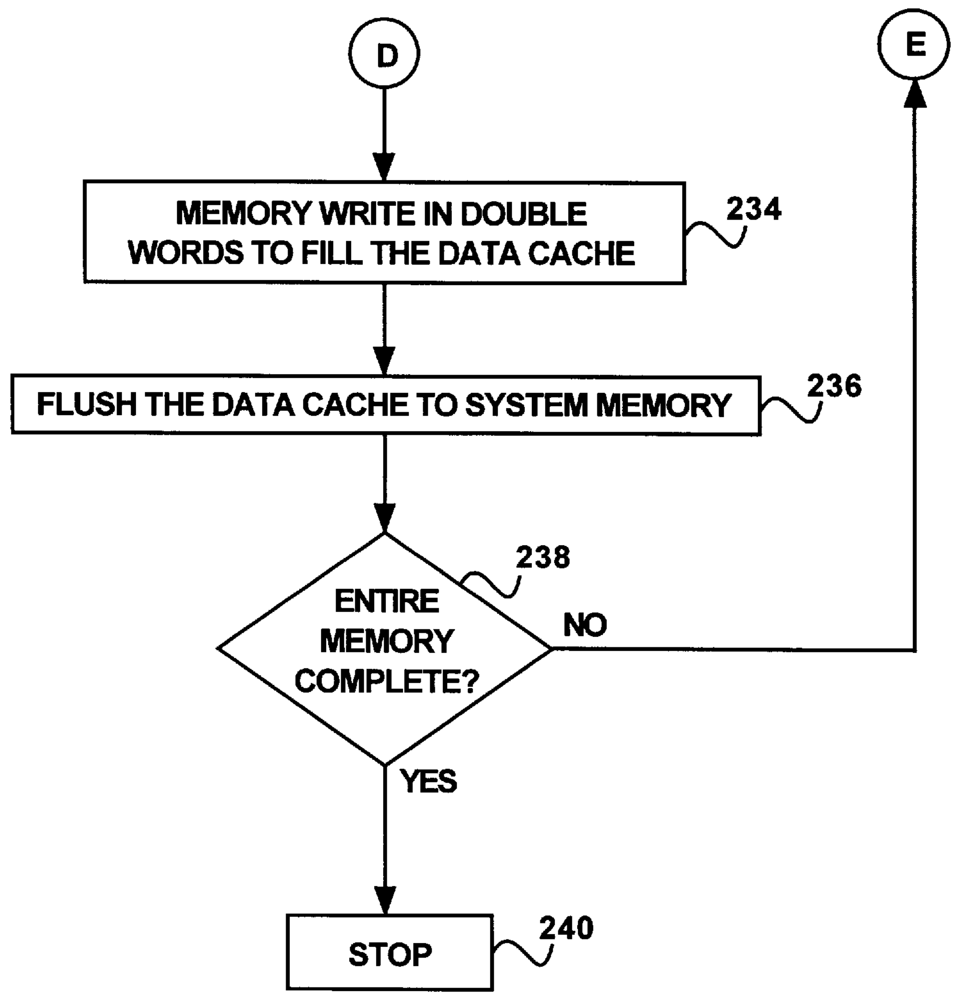

The next portion of the flowchart illustrated in FIGS. 2*b* and 2*c* will use the data cache and the burst capability of the microprocessor system to perform the basic system memory test. Therefore, the burst mode capability of the system is used to write test values into system memory and to read the test values from system memory for comparison.

In step 214, the ECC error reporting is now enabled for this purpose because system memory has been filled as previously indicated. Next, a loop is employed in which system memory is tested in 8 kilobyte data cache sized blocks using the data cache. As previously indicated, although this is more complex than the typical approach, because of the speed of the data cache, this test will occur at a greater efficiency in terms of speed. First, in step 216, similar to step 206, a single double word memory location per data cache line, in this particular embodiment 32 bytes, is read until the data cache is filled with 8 kilobytes of data from system memory. Next, in step 218, system memory is written to fill the 8 kilobyte data cache with a test pattern, again, using double words in this particular embodiment. It will, of course, be appreciated that any one of a number of test patterns may be employed and the invention is not limited in scope to any particular test pattern. Likewise, the invention is not limited in scope to writing double words, although, again, this provides greater efficiency. As indicated in step 220, the 8 kilobyte data cache in this particular embodiment is then flushed to system memory. As previously indicated, this flush may occur by thrashing or by explicitly writing back. Therefore, steps 216 to 220 have transferred a test pattern to a selected 8 kilobyte portion of system memory using the efficiency of the data cache and the burst mode capability of the microprocessor system.

In step 224, a single double word memory location per data cache line is read so that the test pattern now in system memory is read to fill the 8 kilobyte data cache. The values now in data cache 110 are compared with the test pattern values for a match, as indicated by diamond 226. If a match occurs successfully for each test value, then the loop is continued until the entire system memory has been tested in this fashion in this particular embodiment, as indicated by diamond 230.

The next loop is then employed to initialize system memory to a consistent value. In step 232, again, a single double word memory location read per data cache line is employed successively until the 8 kilobyte data cache is filled. In step 234, double word write operations to system memory fill the data cache with the particular values chosen to initialize memory. Finally in step 236, the data cache is flushed to system memory, as similarly indicated previously. As indicated in decision block 238, this loop is continued until the entire memory has been initialized to the desired value.

As indicated previously, while employing the burst mode capability of the microprocessor system in this fashion to test system memory is more complicated than the typical approach employed to test system memory, the system memory is tested much more quickly. It will, of course, be appreciated that the invention is not limited to the particular embodiment illustrated in FIG. 2. Many variations may exist that exploit this burst mode capability. For example, the above approach may be applied to only selected portions of system memory.

In another embodiment, a method of testing system memory in accordance with the invention that employs the burst mode capability of the system bus, such as system bus 103 illustrated in FIG. 1, employs the feature previously referred to in this context as write combining. For example, in the Pentium Pro microprocessor this is referred to as uncacheable, speculative, write combining (USWC).

Figure 3A:
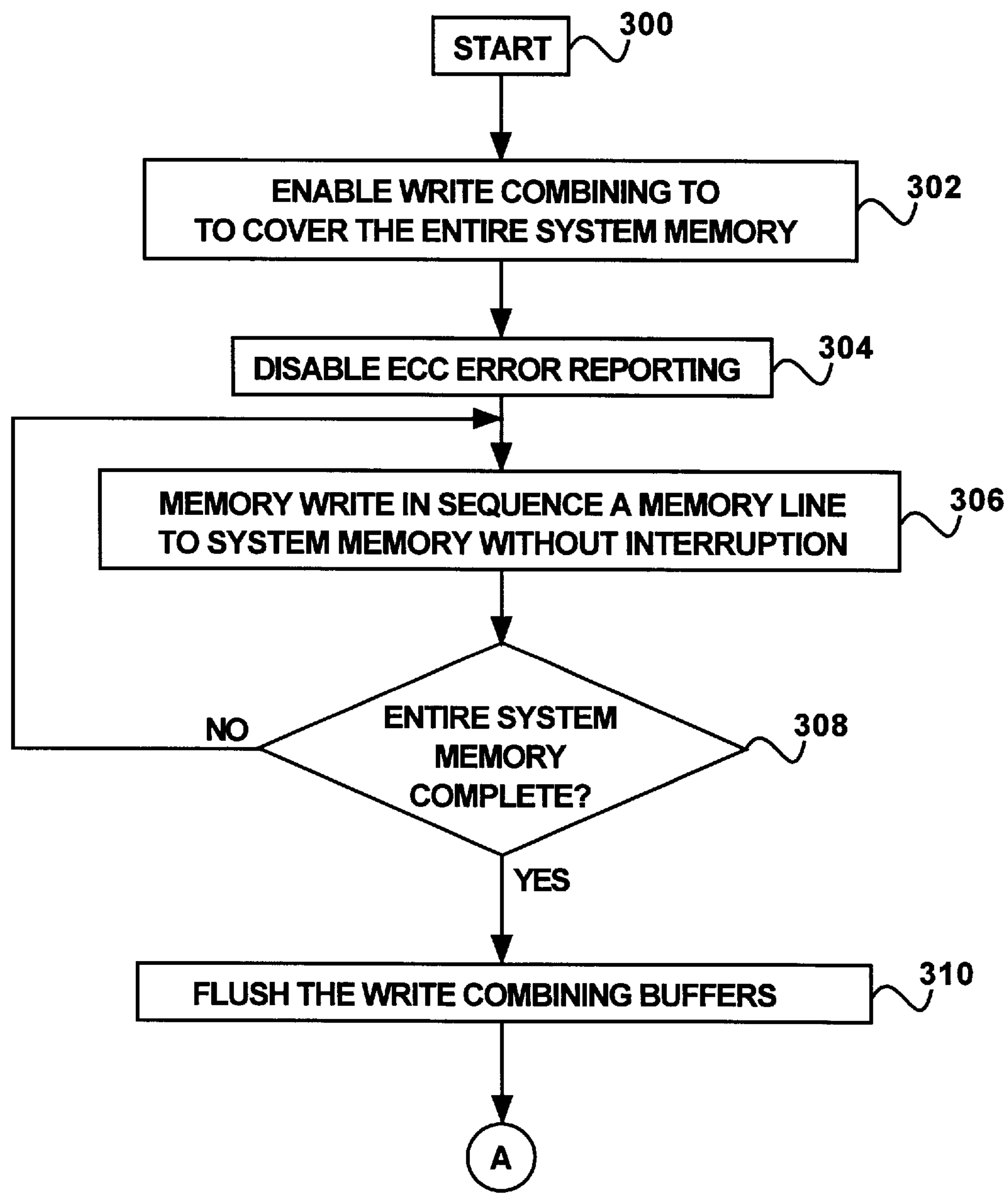
FIGS. 3*a*–3*c* are flowcharts illustrating another embodiment of a method of testing system memory in accordance with the invention.
Figure 3B:
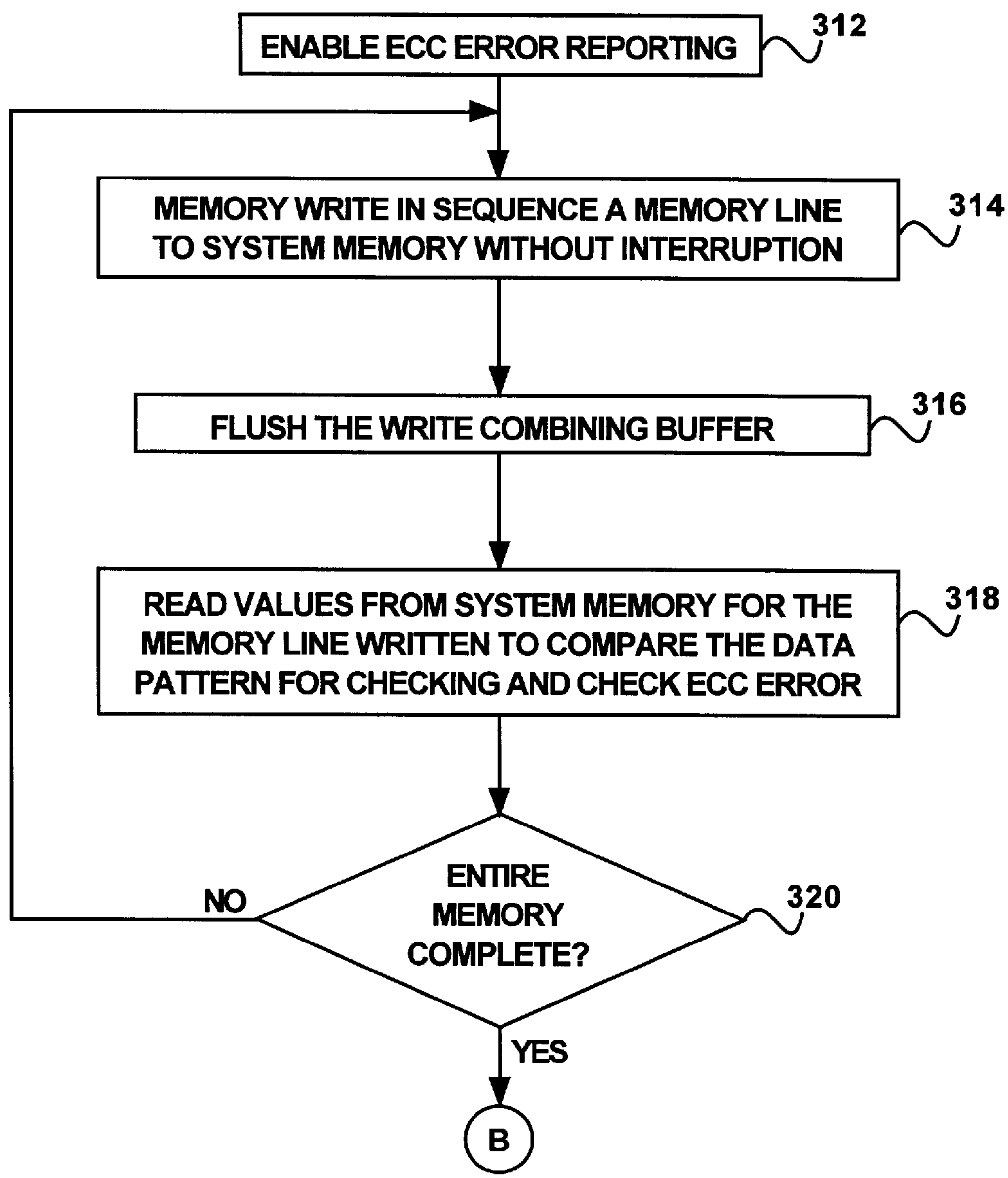
Figure 3C:
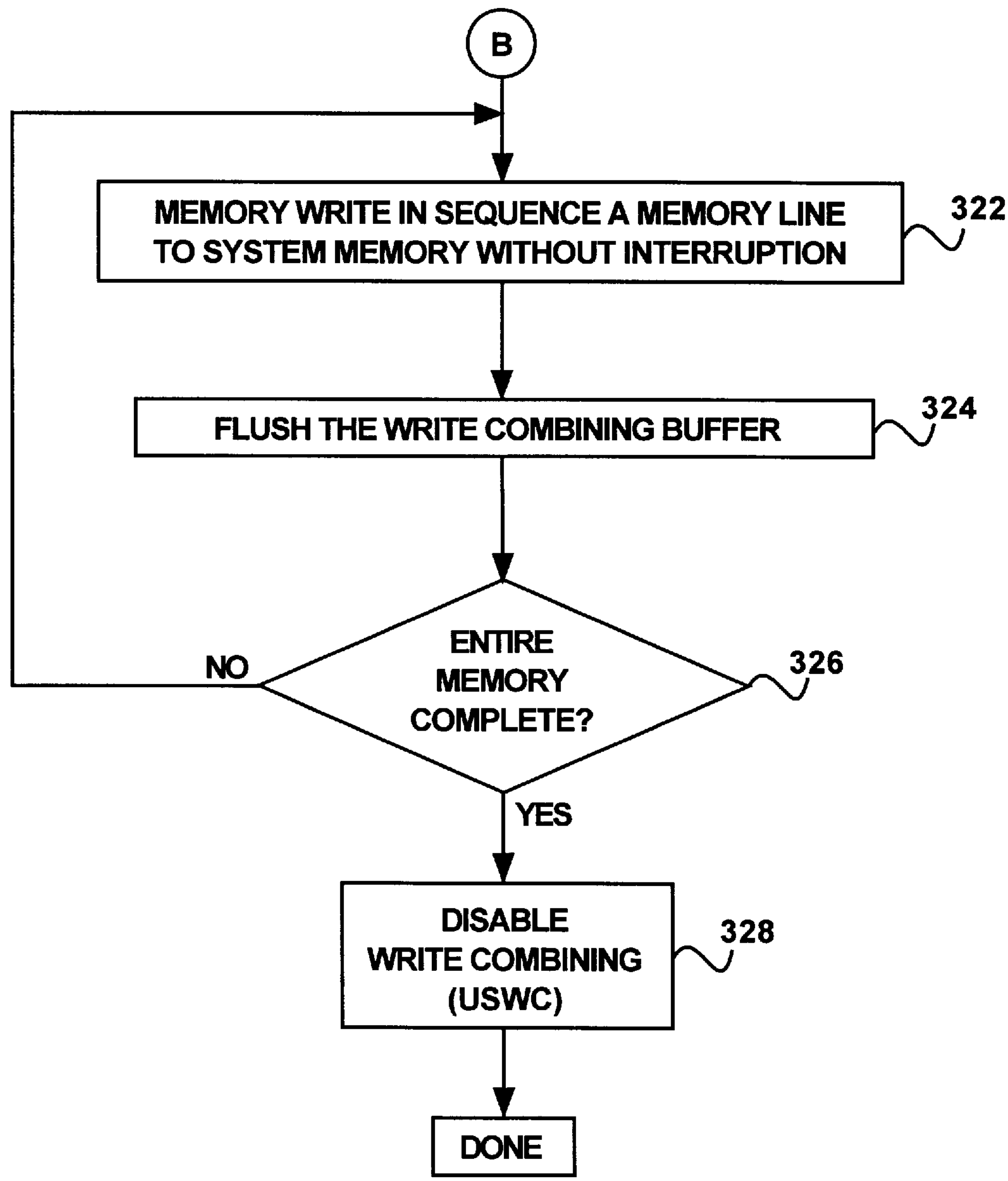

Referring now to FIG. 3*a,* step 302, write combining is first enabled to cover all of system memory, similar with the previous embodiment. Again, the invention is not limited in scope in this respect. In step 304, ECC error reporting is disabled for the system memory fill operation. Next, a loop is employed to initialize system memory. In step 306, the microprocessor combines a number of sequential writes and performs them as a single burst cycle. This process is continued, as diamond 308 indicates, until all of system memory has been initialized. In step 310, after each memory line has been written, the write combining buffer is flushed. This step is performed because data may otherwise remain in the buffer. Thus, in this particular embodiment, the burst mode capability of the microprocessor system is employed using the write combining feature, in contrast to the prior embodiment in which the data cache was utilized.

In step 312, the ECC error reporting is enabled, similar with the embodiment illustrated in FIG. 2. System memory is written in double words, in sequence, using write combining, providing a test pattern, in step 314. The write combining buffer is flushed in step 316 before performing any read operations. Next, values are read from system memory for the memory line that has just been written in order to compare with the test pattern, as indicated in step 318. In diamond 320, this process is continued until all of system memory has been tested.

The next loop operates to initialize system memory to a consistent value. A system memory write operation in sequence using write combining occurs in step 322. This is similar to previously described steps 306 and 314. The write combining buffer is flushed in step 324 at the end. In diamond 326, if the entire system memory has not been set to a consistent value, the loop continues until this is complete. Therefore, USWC is disabled.

As previously indicated, the invention is not limited in scope to the previous embodiments. Furthermore, various aspects of the prior embodiments may be combined to provide yet other embodiments of a method of testing system memory in accordance with the invention.

While certain features of the invention have been illustrated as described herein, many modifications, substitutions, changes and equivalents will now occur to those skilled in the art. It is, therefore, to be understood that the appended claims are intended to cover all such modifications and changes as fall within the true spirit of the invention.

We claim:

1. A method of testing at least a selected portion of system memory for a microprocessor system, said microprocessor system having burst mode capability to transfer data values between the microprocessor and the system memory via a system bus that will introduce a transfer bottleneck when performing uncached data value transfers, said method comprising the steps of:

writing at least a selected portion of system memory with a predetermined test pattern over the system bus using the burst mode capability of the microprocessor system;

reading back values from the at least a selected portion of system memory over the system bus using the burst mode capability of the microprocessor system; and comparing the values read from the at least a selected portion of system memory with the predetermined test pattern written.

2. The method of claim 1, wherein the microprocessor includes a data cache adapted for performing burst mode operations, and wherein the step of writing using the burst mode capability of the microprocessor system comprises using the data cache to perform burst mode operations.

3. The method of claim 2, wherein the step of reading back values over the system bus using the burst mode capability of the microprocessor system comprises using the data cache to perform burst mode operations.

4. The method of claim 3, wherein the at least a selected portion of system memory comprises a data cache sized block of system memory; and further comprising performing the steps of writing, reading and comparing in data cache sized blocks over the remaining entire system memory.

5. The method of claim 1, and further comprising, prior to the writing, reading, and comparing steps, initializing the entire system memory using the burst mode capability of the microprocessor system.

6. The method of claim 4, and further compromising, after the step of performing, filling the entire system memory with a consistent data value over the system bus using the burst mode capability of the microprocessor system.

7. A method of testing at least a selected portion of system memory for a microprocessor system, said microprocessor system having burst mode capability to transfer data values between the microprocessor and the system memory via a system bus, said method comprising the steps of:

writing at least a selected portion of system memory with a predetermined test pattern using the burst mode capability of the microprocessor system;

reading back values from the at least a selected portion of system memory using the burst mode capability of the microprocessor system; and comparing the values read from the at least a selected portion of system memory with the predetermined test pattern written; wherein the microprocessor system includes a write combining capability executed using a burst mode operation; wherein the step of writing using the burst mode capability of the microprocessor system comprises using the write combining capability of the microprocessor system; and wherein the step of reading using the burst mode capability of the microprocessor system comprises using the write combining capability of the microprocessor system.

8. The method of claim 7, wherein the at least a selected portion of system memory comprises a memory line, and further comprising performing the steps of writing, reading and comparing a memory line at a time over the entire system memory.

9. The method of claim 8, and further comprising, prior to the writing, reading, and comparing steps, initializing the entire system memory using the burst mode capability of the microprocessor system.

10. The method of claim 8, and further comprising, after the step of performing, filling the entire system memory with a consistent data value using the burst mode capability of the microprocessor system.

11. A microprocessor system, including a microprocessor, having burst mode capability to transfer data values between the microprocessor and a system memory via a system bus that will introduce a transfer bottleneck when performing uncached data value transfers, said microprocessor system comprising a storage medium coupled thereto, said storage medium including machine-readable code stored thereon, wherein said machine-readable code is adapted, so that, when executed, the microprocessor system via the system bus uses burst mode operations to transfer data signal values between the microprocessor and the system memory during a test of at least a selected portion of the system memory.

12. The microprocessor system of claim 11, wherein said microprocessor includes a data cache adapted to perform burst mode operations via the system bus, and wherein said machine-readable code is further adapted so that, when executed, the microprocessor system uses the data cache to facilitate the transfer of data signal values between the microprocessor and the system memory during a test of at least a selected portion of system memory.

13. The microprocessor system of claim 11, wherein said machine-readable code is further adapted, so that, when executed, the microprocessor system further uses burst mode operations to transfer, via the system bus, data signal values between the microprocessor and the system memory during initialization of the entire system memory, before said test of at least a portion of system memory.

14. The microprocessor system of claim 11, wherein said machine-readable code is further adapted so that, when executed, the microprocessor system further uses burst mode operations to transfer, via the system bus, data signal values between the microprocessor and the system memory to fill the entire system memory, after said test of at least a portion of system memory.

15. A microprocessor system having burst mode capability to transfer data values between the microprocessor and a system memory via a system bus, said microprocessor system comprising a storage medium coupled thereto, said storage medium including machine-readable code stored thereon, wherein said machine-readable code is adapted, so that, when executed, the microprocessor system uses burst mode operations to transfer data signal values between the microprocessor and the system memory during a test of at least a selected portion of the system memory; wherein said microprocessor includes a write combining capability executed using burst mode operations via the system bus; and wherein said machine-readable code is further adapted, so that, when executed, the microprocessor uses the write combining capability to transfer data signal values between the microprocessor and the system memory during a test of at least a selected portion of system memory.

16. A method of testing at least a selected portion of system memory for a microprocessor system, said microprocessor system having burst mode capability to transfer data values between the microprocessor and the system memory via a system bus, said method comprising the steps of:

writing at least a selected portion of system memory with a predetermined test pattern using the burst mode capability of the microprocessor system;

reading back values from the at least a selected portion of system memory using the burst mode capability of the microprocessor system; and comparing the values read from the at least a selected portion of system memory with the predetermined test pattern written; wherein the microprocessor includes a data write back cache feature executed using a burst mode operation; and wherein the step of writing using the burst mode capability of the microprocessor comprises using the data write back cache feature of the microprocessor system.

17. A microprocessor system having burst mode capability to transfer data values between the microprocessor and a system memory via a system bus, said microprocessor system comprising a storage medium coupled thereto, said storage medium including machine-readable code stored thereon, wherein said machine-readable code is adapted, so that, when executed, the microprocessor system uses burst mode operations to transfer data signal values between the microprocessor and the system memory during a test of at least a selected portion of the system memory; wherein said microprocessor includes a write back cache feature capability executed using burst mode operations via the system bus; and wherein said machine-readable code is further adapted, so that, when executed, the microprocessor uses the write back cache feature to transfer data signal values between the microprocessor and the system memory during a test of at least a selected portion of system memory.

* * * * *